United States Patent [19]
Boudreau et al.

[11] Patent Number: 5,694,048
[45] Date of Patent: Dec. 2, 1997

[54] MONITOR-DETECTOR ASSEMBLY ON SILICON WAFER BOARD

[75] Inventors: Robert A. Boudreau, Hummelstown; Hongtao Han, Mechanicsburg, both of Pa.; Robert Wallace Roff, Westfield; Randall Brian Wilson, Maplewood, both of N.J.

[73] Assignee: The Whitaker Corporation, Wilmington, Del.

[21] Appl. No.: 414,893

[22] Filed: Mar. 31, 1995

Related U.S. Application Data

[63] Continuation-in-part of Ser. No. 393,961, Feb. 24, 1995.
[51] Int. Cl.⁶ .............................. G01R 31/28; H01S 3/04; G02B 6/36
[52] U.S. Cl. .............................. 324/752; 372/36; 385/25
[58] Field of Search .............................. 324/752; 357/30; 250/227.24; 385/89; 372/42, 96

[56] References Cited

U.S. PATENT DOCUMENTS

| | | | |
|---|---|---|---|
| 4,210,923 | 7/1980 | North et al. | 357/30 |
| 4,897,711 | 1/1990 | Blonder et al. | 357/74 |
| 5,181,216 | 1/1993 | Ackerman et al. | 372/36 |
| 5,357,103 | 10/1994 | Sasaki | 250/227 |
| 5,479,426 | 12/1995 | Nakanishi et al. | 372/43 |

FOREIGN PATENT DOCUMENTS

| | | | |
|---|---|---|---|
| 0 208 977 | 1/1987 | European Pat. Off. | G01R 31/28 |
| 6053552 | 5/1994 | Japan | H01L 33/00 |

OTHER PUBLICATIONS

*IEEE Transactions On Components, Hybrids And Manufacturing Technology;* "Gigabit Transmitter Array Modules On Silicon Waferboard"; Craig A. Armiento; vol. 15; No. 6; Dec. 1992.

"1995 Proceedings 45th Electronic Components & Technology Conference–May 21–May 24, 1995"; pp. 841–845.

*Electronic Letters* "Self–Aligned Flat–Pack Fibre–Photodiode Coupling"; Jul. 1988; vol. 24; No. 15.

PCT International Search Report. International Application No. PCT/US96/02334; International Filing Date Feb. 14, 1996.

*Primary Examiner*—Ernest F. Karlsen
*Assistant Examiner*—Barry C. Bowser
*Attorney, Agent, or Firm*—W. Francos

[57] ABSTRACT

An optical subassembly for monitoring the emission of a semi-conductor laser is disclosed. The subassembly is diced from a wafer having mounted thereon the devices to be tested as well as the testing optical devices. The devices of the wafer are burned-in and those sections of the wafer having lasers that pass the burn-in testing are diced and form the subassemblies of the present invention.

13 Claims, 4 Drawing Sheets

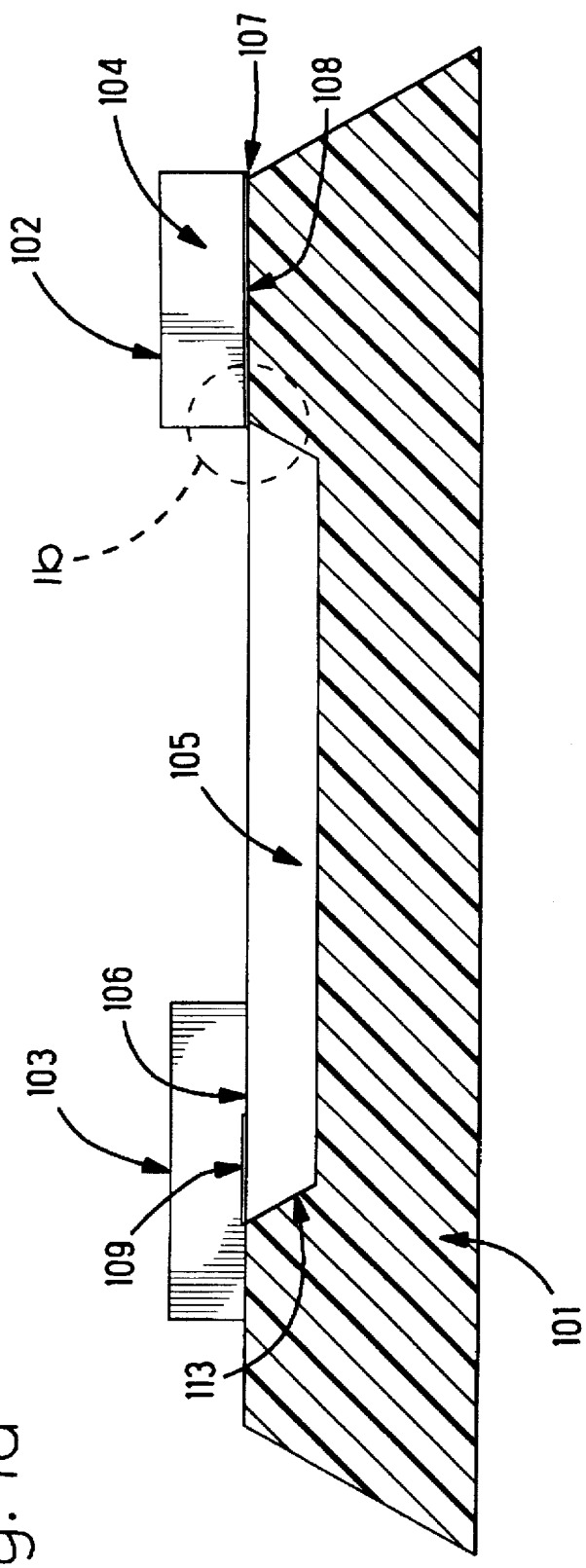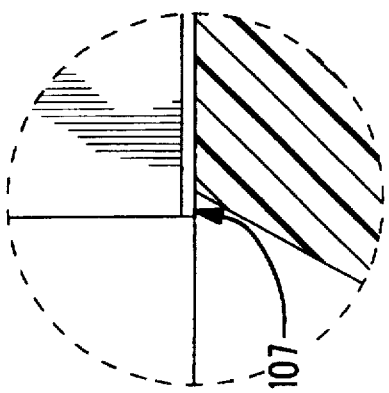

MONITOR-DETECTOR ASSEMBLY ON SILICON WAFER BOARD

This application is a continuation-in-part of U.S. patent application Ser. No. 08/393,961 (TWC Docket 16099) filed Feb. 24, 1995.

FIELD OF THE INVENTION

The present invention relates to an integrated Monitor-Detector for light emitting devices on silicon waferboard.

BACKGROUND OF THE INVENTION

The monitoring of lasers during their operation is essential to assure their function. During operation, as the affects of joule heating of the operating device as well as the affects of normal operation over time and ambient temperature changes alter the lasing threshold of the laser. As a result the injection current to the device will have to be changed to maintain a constant power output. The best way to assure that the device is properly operating at all times is to have a suitable detector mounted and aligned to receive a portion of the radiation emitted from the laser. The monitor-detector then is connected to suitable circuitry to vary the injection current to the laser to assure that lasing is achieved during the operation of the device at steady state output power.

Normally, the monitoring of the laser is effected by a submount assembly that is fabricated specially for the monitoring function. This subassembly is then mounted in the particular laser application assembly or mount. The submount requires the alignment of the monitor-detector and the laser. As can be appreciated, the alignment and focusing of the various devices and elements of such a submount can prove to be very labor intensive, and thereby come at an increased cost. What is needed is a subassembly that is readily fabricated and that allows for passive alignment of the monitor-detector and the laser.

SUMMARY OF THE INVENTION

A subassembly for monitoring the emission of a semiconductor laser is disclosed. The subassembly is diced from a wafer having mounted and etched thereon the devices to be tested as well as the testing devices. The devices of the wafer are burned-in and those sections of the wafer having lasers that pass the burn-in testing are diced and form the subassemblies of the present invention.

OBJECTS, FEATURES AND ADVANTAGES OF THE INVENTION

It is an object of the present invention to have an optical subassembly having a laser and a monitor-detector in passive alignment.

It is a feature of the present invention to have the monitor-detector in optical communication with the laser under test via selectively etched grooves in a silicon waferboard substrate on which the laser and monitor detector are mounted.

It is a feature of the present invention to have multiple monitor-detector and laser subassemblies mounted on a single wafer so that multiple submounts can be diced out of the wafer.

It is an advantage of the present invention to have a monitor-detector and laser subassembly ready for mounting in an optical assembly having been burn-in tested thereby increasing production yield and thus reducing greatly the cost of production of optical assemblies.

BRIEF DESCRIPTION OF THE DRAWINGS

FIG. 1a is a side view in cross-section of the monitor-detector in optical communication with the laser under monitor.

FIG. 1B is an enlarged view of the overhang of the laser.

DETAILED DESCRIPTION OF THE PREFERRED EMBODIMENTS

Figure 2A:
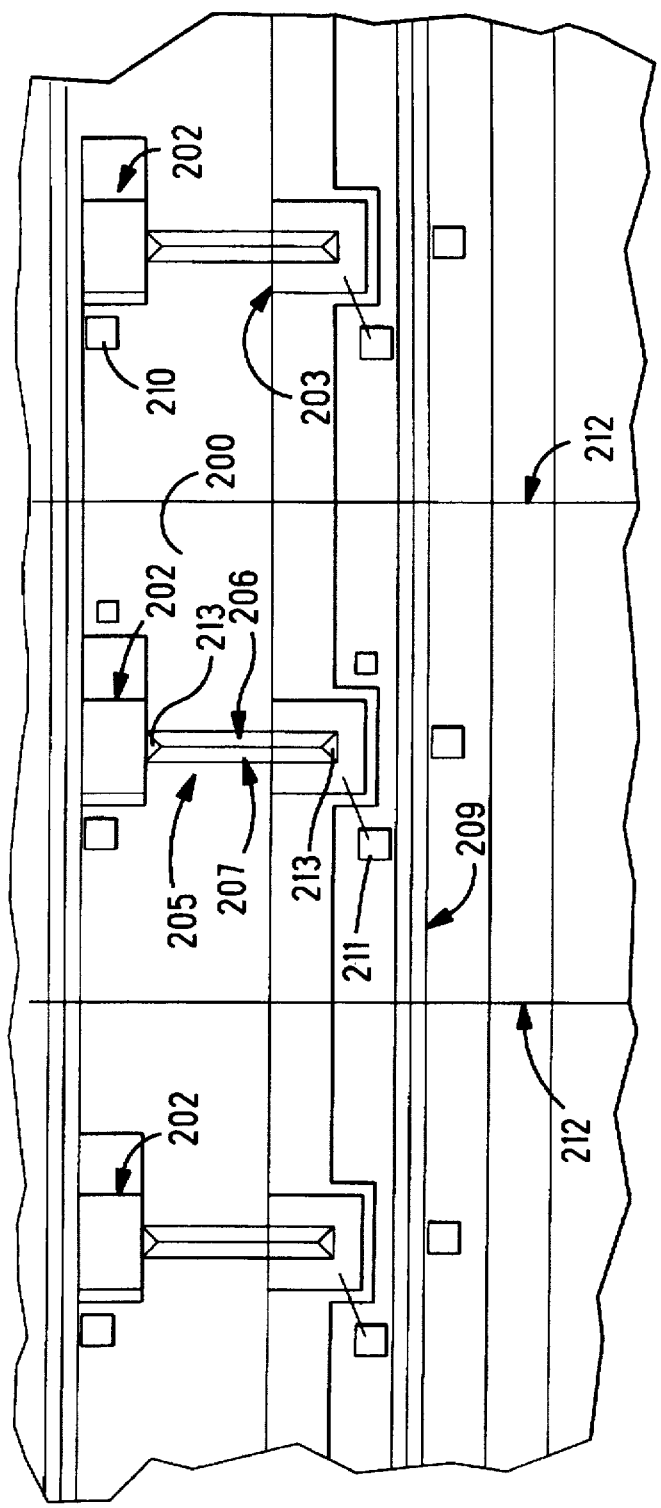
FIGS. 2A and 2B are top views of a portion of a wafer having mounted thereon the monitor-detector and the laser as well as the v-grooves etched to effect the dicing of the submounts as well as to enable the reflection of light from the laser to the monitor detector.

Turning to FIG. 1, we see a cross-sectional view of the submount 101. The laser 102 is monitored by the detector 103 as is described presently. The laser 102 is an edge emitting device having its active stripe down as shown at 104. The laser emits a substantially conical radiation field as shown. A portion of the light emitted by the laser is reflected off the surface of the v-grooves 105 and its end wall 113 which are etched into the substrate as is described herein. The light is then impingent on the lower surface 106 of the detector 103. This reflected light is coupled to detector 103 with adequate efficiency to enable monitoring of the output power of the laser. Due to the reflectivity of the etched monocrystalline material at the v-groove 105, it is not necessary to deposit a reflector such as metal to enable light to traverse the groove and be reflected to the detector 103. However, it is certainly possible to deposit a layer of reflective metal by standard vacuum deposition for example to assist in the reflection from the laser to the detector. For example, a metal such as gold will suffice for this purpose. In addition, it is important to note that a focusing or coupling element can be disposed in the groove 105 for facilitating the coupling of light between the laser and the detector. For example a GRIN rod lens or graded index fiber could serve in this manner. The groove 105 is for example a v-groove, but can be of a different shape depending on the etching process used to effect the groove. For example, a common variation would include a substantially flat bottom to provide a trapezoidal shape. This groove is shown in the various Figures to separate the detector and laser. However, it is within the purview of the invention to have this groove substantially shorter in length than that shown in the Figures. To be sure, the groove 105 between the detector and the laser can be so short that the laser and detector are in physical contact at the shortest limit of the groove 105. The critical factor is that the groove 105 merely reflects light from the laser to the detector. The laser monitored may be any of a variety of edge emitting lasers, to include but not be limited to heterostructure devices to include planar or buried crescent structures. The detector 103 used for monitoring laser output may be any of a variety of photodetectors, for example PIN or Metal Semiconductor Metal (MSM) detectors.

As is shown in FIG. 1, both the detector 103 and the laser 102 are bonded to the substrate of the submount by standard die-bonding techniques. The laser 102 overhangs to enable the bonding to be effected while retaining a clean emitting surface, as any solder on the surface of the light emitting section will interfere with its operation. The overhang of the laser as shown at 107 is generally of the dimension of about 2 microns, with the die bonding as shown at 108. The detector on the other hand must overhang the edge of the etched groove 105 to allow the light from the laser to be reflected via the endwall 113 to be impingent upon the photosensistive surface 109 of the detector 103. While the photosensitive surface 109 is shown at the lower surface of the detector, those of ordinary skill in the art will support that this photosensitive region could be disposed on the top surface of the detector. The overhang of the detector is generally of the dimension of 25 to 1000 microns. Similarly, the die bonding of the detector is effected by standard techniques, and the overhang of the detector allows the photosensitive region of the detector to remain clean during operation.

The etching and dicing of the submounts is discussed presently. Turning to FIG. 2a, we see a top view of a few submounts on the wafer. The wafer is chosen to be of a monocrystalline material, preferably silicon, however other monocrystalline materials that can be etched to reveal defined crystallographic planes can function for the substrate 200 of the submounts. The v-grooves 205 that are used to effect the optical path between the detector 203 and the laser 202 are fabricated by standard technique. For example, choosing the substrate surface to be in the (100) crystallographic plane, at the surface of the substrate to enable selective etching to reveal the grooves. The selective etching of the substrate reveals sidewalls 206 and 207 and endwalls 213 that are in the (111) crystallographic family of planes. Preferably sidewalls have an included angle of 70.6°, and the endwall forms an included angle of 125.3° with the apex of the v-groove. To effect etching on, for example, a (100) oriented silicon wafer, a photolithographically patterned mask preferably of silicon nitride, less preferably silicon dioxide or special polymer material is laid down on the substrate surface. The mask is grown, deposited or spin coated on the substrate. Finally, an anisotropic etchant is applied and the unmasked (100) surfaces etch rapidly and reveal the (111) family of crystalline planes. A typical anisotropic etchant is KOH, however, ammonium hydroxide, tetramethyl ammonium hydroxide, hydrazine or etylenediamine-pyrocatechol water, while less preferable, will work as the etchant. The revealed crystal planes etch so slowly that the etching process automatically ceases leaving mechanical features that are controlled by mask dimensions. It is known that the groove depth is directly proportional to the width of the mask opening. It is important to note that the grooves 205 and 209 are exemplary v-shaped grooves (v-grooves), however, these can be readily fabricated of a different shape by varying the etching process. Details of the etching process are disclosed in *Optoelectronic Integration: Physics, Technology and Applications* (1994, Kluwer Academic Publishers) Chapter 10, Section 4.3.1 and U.S. Pat. No. 4,210,923 to North et al., the disclosures of which are specifically incorporated herein by reference.

Figure 2B:
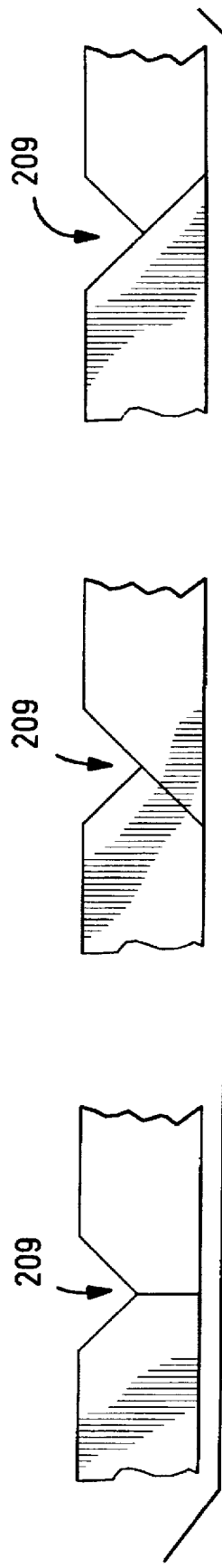
Figure 3:
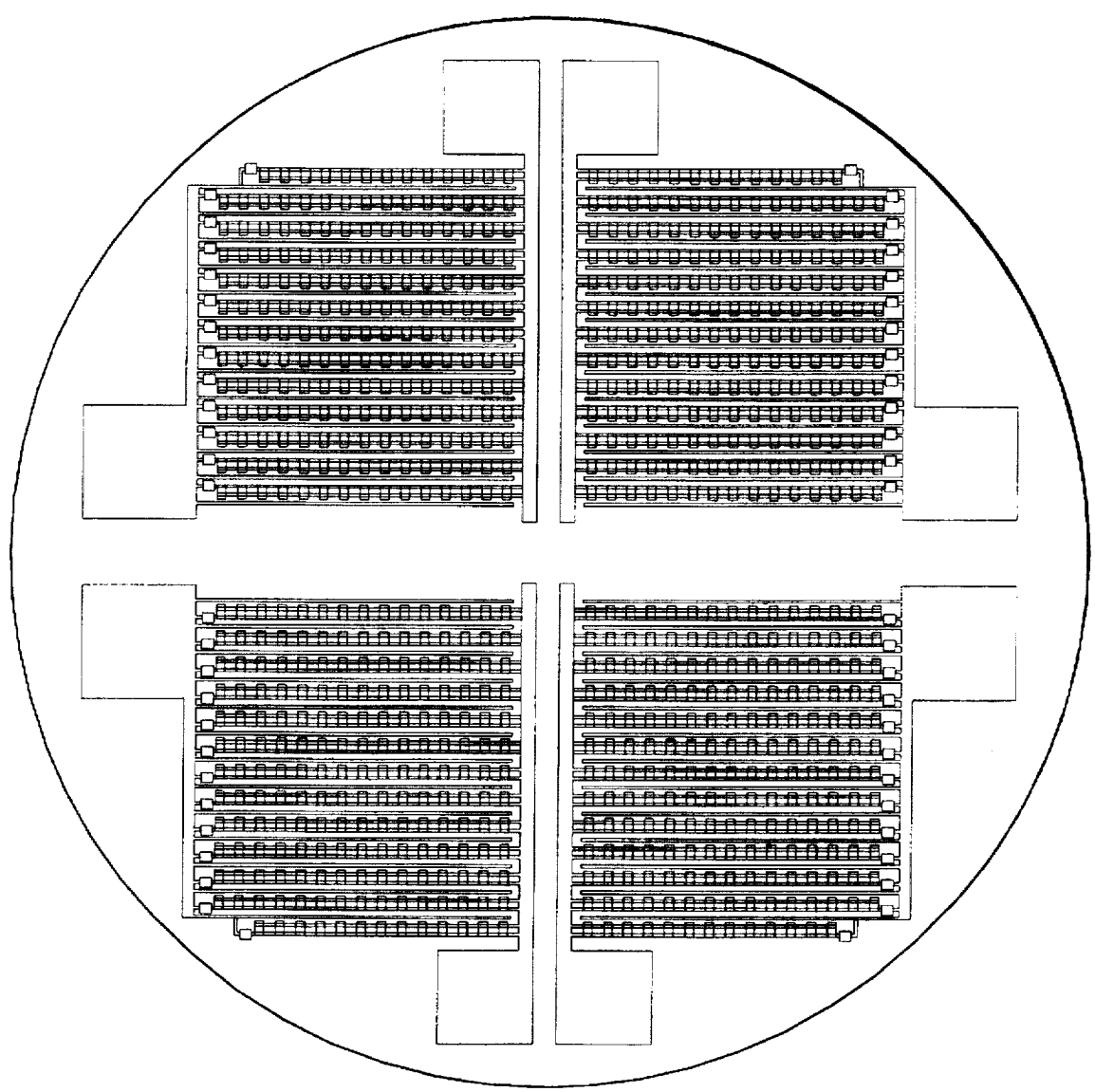
FIG. 3 is a top view of a wafer having an array of submounts having the monitor-detector and laser assemblies shown in portion in FIG. 2.
Figure 4:
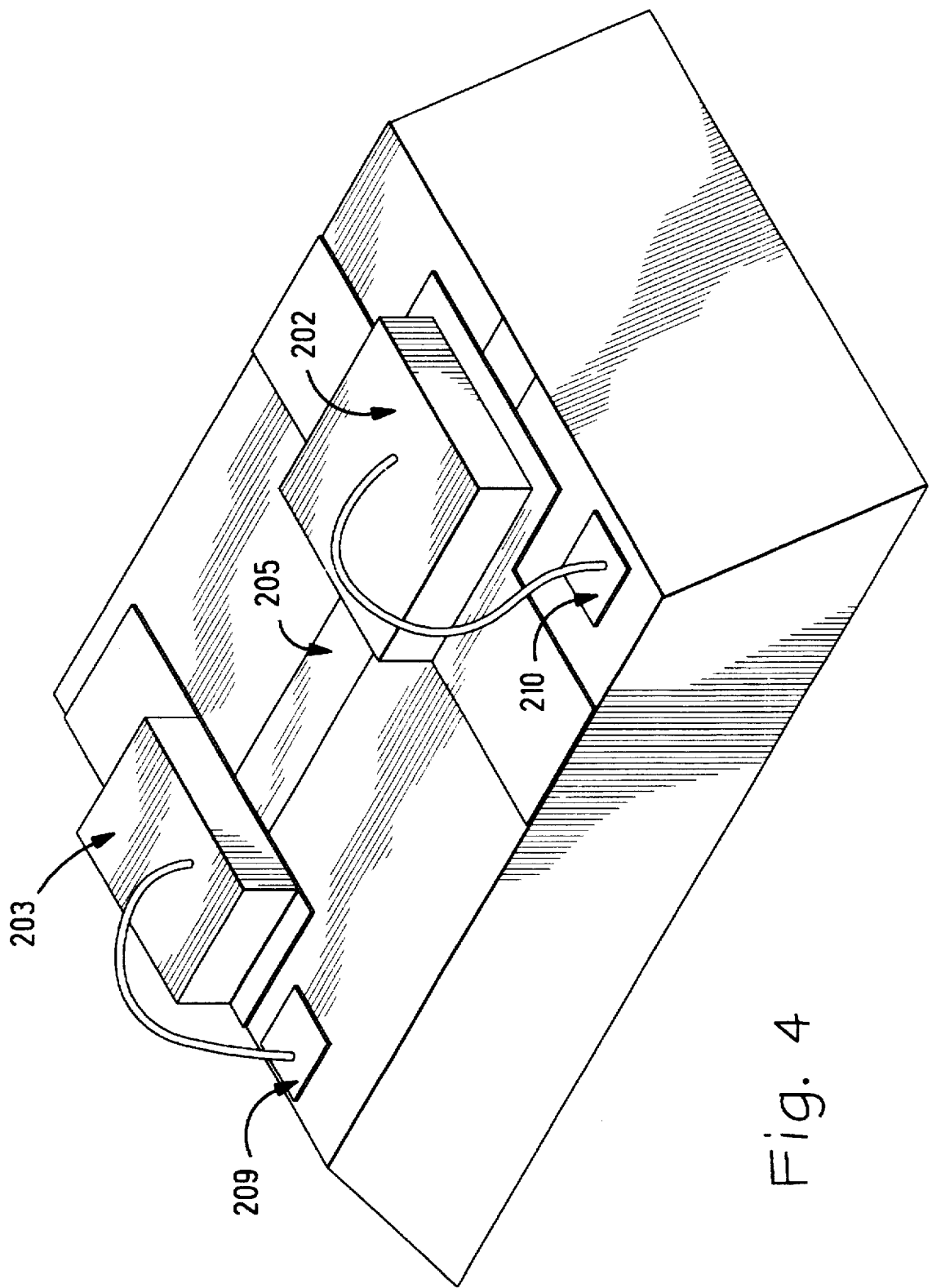
FIG. 4 is a three-dimensional view of the submount of the preferred embodiment of the present invention.

The v-grooves 209 are fabricated by identical techniques, and are used for sectioning the submounts from the wafer. Finally contact pads 210 and 211 for wire bonding electrical to external circuitry (not shown) are made by depositing known standard metals such as Ti/Pt/Au or Al/Au or Cr/Au preferably by vacuum deposition. The submounts consisting of the laser, monitor-detector and v-groove 205 are then diced from the wafer. To effect this, the v-grooves 209 are used as cleavage planes to facilitate the dicing of the submounts. This dicing is best understood to be a fracture of the crystalline material along the v-grooves 209. The preferred fracture lines are shown in FIG. 2b. Next, the final step in the dicing process is carried out by scribing along the line 212 and breaking along the scribed line. This process must be done by vacuum retention of the wafer as use of an anvil on top of the wafer would result in damage to the optoelectronics on the substrate. This procedure is effected by the use of the Dynatex DX-III Scriber-Breaker. The final assembly is shown after the dicing operation in FIG. 4. This subassembly is readily mounted in an optical assembly for operational use.

The preferred embodiment of the present invention having been described, it is evident that the artisan of ordinary skill that other materials and various devices could be used to effect submounts for use in optical assemblies. These are considered within the theme and spirit of the invention. In general, the materials, etchants devices and methods of their use are chosen for description of the preferred embodiment, and may be changed without departing from the spirit of the invention.

We claim:

1. An optical submount, comprising:
  a substrate having a top surface, and a bottom surface; a laser mounted on said top surface; a photodetector for monitoring light from said laser mounted on said top surface; and a groove on said top surface disposed between said photodetector and said laser, said groove enabling light from said laser to impinge on said photodetector.

2. An optical submount as recited in claim 1, wherein said laser is an edge emitting laser.

3. An optical submount as recited in claim 1, wherein said photodetector is a PIN photodiode.

4. An optical submount as recited in claim 1, wherein said substrate is a monocrystalline material.

5. An optical submount as recited in claim 4, wherein said groove is etched in said substrate.

6. An array of optical submounts, comprising:
  a. A wafer of monocrystalline material having a top surface and a bottom surface, said wafer having a plurality of photodetectors and lasers mounted on said top surface, each of said photodetectors in optical communication with one of said lasers;
  b. A first plurality of grooves disposed on said top surface for enabling light to traverse from one of said lasers to one of said photodetectors; and
  c. A second plurality of grooves disposed on said top surface for facilitating the dicing of said wafer into individual submounts.

7. An array of optical submounts as recited in claim 6, wherein said grooves are etched into said top surface of said wafer.

8. An optical submount, comprising:
  a. A substrate of monocrystalline material having a top surface and a bottom surface;
  b. A photodetector mounted on said top surface;
  c. A laser mounted on said top surface;
  d. A groove etched into said top surface for transmitting a portion of said light from said laser to said photodetector, thereby enabling the output of said laser to be monitored by said photodetector.

9. An optical submount as recited in claim 8, wherein said groove has a reflective surface disposed thereon to facilitate the reflection of light from said laser to said detector.

10. An optical submount as recited in claim 8, wherein said photodetector mounted on said top surface has a portion overhanging said groove, said portion overhanging said groove having a photosensitive portion of said photodetector.

11. An optical submount as recited in claim 8, wherein said laser mounted on said top surface has a portion thereof overhanging said groove thereby enabling die bonding of said laser to be effected without interfering with the output of said laser.

12. An optical submount, comprising:

a substrate of monocrystalline material having a top surface and a bottom surface; a photodetector mounted on said top surface; a laser mounted on said top surface; and an etched groove on said top surface for transmitting a portion of light from said laser to said photodetector; and a reflective surface on said groove for facilitating the reflection of light from said laser to said photodetector, whereby light output of said laser is monitored by said photodetector.

13. An optical submount as recited in claim 12 wherein said laser mounted on said top surface has a portion thereof overhanging said groove thereby enabling die bonding of said laser to be effected without interfering with the output of said laser.

* * * * *